(12) United States Patent　(10) Patent No.:　US 11,955,367 B2
Tanabe et al.　(45) Date of Patent:　Apr. 9, 2024

(54) FILM FORMATION APPARATUS

(71) Applicant: Shibaura Mechatronics Corporation, Yokohama (JP)

(72) Inventors: Shohei Tanabe, Yokohama (JP); Koji Yoshimura, Yokohama (JP); Ryo Matsuhashi, Yokohama (JP)

(73) Assignee: SHIBAURA MECHATRONICS CORPORATION, Yokoshima (JP)

( * ) Notice: Subject to any disclaimer, the term of this patent is extended or adjusted under 35 U.S.C. 154(b) by 323 days.

(21) Appl. No.: 17/474,403

(22) Filed: Sep. 14, 2021

(65) Prior Publication Data

US 2022/0084871 A1　Mar. 17, 2022

(30) Foreign Application Priority Data

Sep. 15, 2020　(JP) ................. 2020-154720

(51) Int. Cl.
*H01L 21/687*　(2006.01)
*H01J 37/32*　(2006.01)
(Continued)

(52) U.S. Cl.
CPC .. *H01L 21/68764* (2013.01); *H01J 37/32082* (2013.01); *H01J 37/321* (2013.01); *H01J 37/3244* (2013.01); *H01J 37/32504* (2013.01); *H01J 37/3435* (2013.01); *H01L 21/02274* (2013.01); *H01J 2237/332* (2013.01)

(58) Field of Classification Search
None
See application file for complete search history.

(56) References Cited

U.S. PATENT DOCUMENTS

| | | | | |
|---|---|---|---|---|
| 4,450,062 A | * | 5/1984 | Macaulay | H01J 37/34 |
| | | | | 204/298.11 |
| 2005/0121311 A1 | * | 6/2005 | Shidoji | C23C 14/352 |
| | | | | 204/298.18 |

(Continued)

FOREIGN PATENT DOCUMENTS

| JP | 2003-166055 A | 6/2003 |
|---|---|---|
| JP | 4321785 A | 6/2009 |

(Continued)

*Primary Examiner* — Jason Berman
(74) *Attorney, Agent, or Firm* — Nath, Goldberg & Meyer; Jerald L. Meyer; Stanley N. Protigal

(57) ABSTRACT

A film deposition apparatus reduces hillock formation while yielding uniform film thickness distribution. A film deposition apparatus of a present embodiment includes: a chamber; a rotary table that circulates and carries a workpiece W along a circumferential transfer path L; multiple targets that contain a film deposition material, and that are provided in positions at different radial distances from a center of rotation of the rotary table; a shield member that forms a film deposition chamber surrounding a region where the film deposition material scatters, and that has an opening on the side facing the circulated and carried workpiece; and a plasma generator that includes a sputter gas introduction unit for introducing a sputter gas into the film deposition chamber, and a power supply unit for applying power to the target, and that generates plasma in the sputter gas G1 in the film deposition chamber.

8 Claims, 4 Drawing Sheets

(51) Int. Cl.
*H01J 37/34* (2006.01)
*H01L 21/02* (2006.01)

(56) References Cited

U.S. PATENT DOCUMENTS

2012/0309191 A1* 12/2012 Miura ............... H01L 21/28512
　　　　　　　　　　　　　　　　　　　　　　　　438/655
2019/0074167 A1* 3/2019 Ono ..................... H01J 37/347

FOREIGN PATENT DOCUMENTS

JP　　　2020-50939 A　　4/2020
TW　　　202012672 A　　4/2020

* cited by examiner

FILM FORMATION APPARATUS

CROSS-REFERENCE TO RELATED APPLICATION

This application is based upon and claims the benefit of priority from Japan Patent Application No. 2020-154720, filed on Sep. 15, 2020, the entire contents of which are incorporated herein by reference.

FIELD OF INVENTION

The present disclosure relates to a film formation apparatus.

BACKGROUND

In a process of manufacturing various products such as semiconductor devices, liquid crystal displays, organic EL displays, and optical disks, a thin film such as an optical film may be formed on a workpiece such as a wafer or a glass substrate. In addition, in a plasma process, a film serving as a corrosion resistant film of a member for a plasma processing device may be formed on a workpiece such as an inner wall material or a jig of the apparatus. These films can be formed by a film formation process for forming a film of a metal or the like on the workpiece, or film treatment such as etching, oxidation, or nitriding on the formed film.

The film formation treatment or film treatment can be performed by various methods, one of which includes generating plasma in a chamber decompressed to a predetermined degree of vacuum and performing the treatment using the plasma. In the film formation treatment, an inert gas is introduced into a chamber in which a target including a film formation material is placed, and power is applied to the target. Hence, the ions of the inert gas turned into plasma are made bombard with the target, and the film formation material ejected from the target is deposited on the workpiece, thereby achieving film formation. Such film formation treatment is called sputtering.

In the film formation treatment, process gas is introduced in a chamber in which an electrode is arranged, and power is applied to the electrode. By this, active materials such as ions and radicals of the plasma process gas are bombarded to the film on the workpiece to perform film formation treatment.

There is a plasma processing apparatus in which a rotary table is mounted inside one chamber so that such film formation treatment and film treatment can be performed in a row, and multiple film formation units and film treatment units are aligned in the circumferential direction above the rotary table. The film formation units and the film treatment units each have a separate processing chamber (a film formation chamber or film treatment chamber). Each processing chamber is open downward (toward the rotary table), and the workpiece is held on the rotary table and conveyed and passed directly under the plurality of processing chambers, thereby forming a film such as an optical film or a corrosion resistant film.

Here, the speed of the workpiece circulated and conveyed by the rotary table is slower on the inner peripheral side near the rotation center of the rotary table than on the outer peripheral side. For this reason, when the amount of film formation material ejected from the target is uniform in the region facing the target, even at the same travel distance (perimeter), the film formation material formation time is longer on the inner peripheral side than on the outer peripheral side, making the film on the inner peripheral side thick. In other words, the film formation rate, which is the accumulated amount or film thickness of the film formation material, is higher on the inner peripheral side than on the outer peripheral side. As a result, the distribution of the thickness of the formed film is not always uniform on the entire film formation target surface of the workpiece.

In one way to deal with this, multiple targets are aligned but in positions at different radial distances from the rotation center of the rotary table, and the power applied to each target is changed, alleviating the non-uniform distribution of formation amount. To be specific, the higher the applied power, the larger the amount of film formation material to be ejected and the larger the amount of deposit. Therefore, the power applied to the target on the inner peripheral side is made lower than on the outer peripheral side in order to minimize the formation amount on the inner peripheral side and alleviate the non-uniformness of amount of deposit.

SUMMARY OF INVENTION

Problems to be Solved by Invention

When the film formation treatment is performed in the film formation apparatus as described above, hillocks may be formed on the film surface. Hillocks are tiny protrusions that protrude from the surface of the film. When such hillocks are formed, the uniformity of the film quality distribution cannot be obtained. Therefore, the appearance and function (for example, optical characteristics and corrosion resistance) may become non-uniform on the film surface, and the quality of the product may not be kept constant. Here, it is generally said that one of the causes of hillock formation is the local plastic deformation of a film caused by the compressive stress generated by a rise in the temperature of the workpiece.

However, although the temperature distribution on the surface of the workpiece is almost uniform, in the film formation apparatus provided with multiple targets as described above, many hillocks tend to be formed on the surface of the workpiece that has undergone film formation by passing through a region facing a target on the inner peripheral side to which lower power is applied. In particular, reducing the power applied to the target on the inner peripheral side in order to ensure the uniformity of the film thickness distribution would lead to hillock formation.

An object of the present disclosure, which has been proposed to solve the aforementioned problems, is to provide a film formation apparatus that reduces hillock formation while yielding uniform film thickness distribution.

Means to Solve the Problem

In order to achieve the aforementioned object, a film formation apparatus of a present embodiment includes: a chamber which an interior thereof can be made vacuum; a rotary table that is provided in the chamber and circulates and carries a workpiece along a circumferential carrying path; multiple targets that include a film formation material to be deposited and become a film on the workpiece, that face the workpiece circulated and carried by the rotary table, and that are provided in positions at different radial distances from a center of rotation of the rotary table; a shield member that forms a film formation chamber surrounding a region where the film formation material from each target scatters, and that has an opening on the side facing the workpiece which is circulated and carried by the rotary table; and a plasma generator that includes a sputter gas introduction unit for introducing a sputter gas into the film formation chamber, and a power supply unit for applying power to the target, and that generates plasma in the sputter gas in the film formation chamber. The time during which the workpiece is exposed to the film formation material through the opening in the region facing the target closest to the center of rotation is shorter than in the region facing the target farthest from the center of rotation.

Effect of Invention

According to an embodiment of the present disclosure, a film formation apparatus that reduces hillock formation while yielding uniform film thickness distribution can be provided.

EMBODIMENTS

An embodiment of a film formation apparatus of the present disclosure will be described in detail with reference to the drawings.

[Overview]

Figure 1:
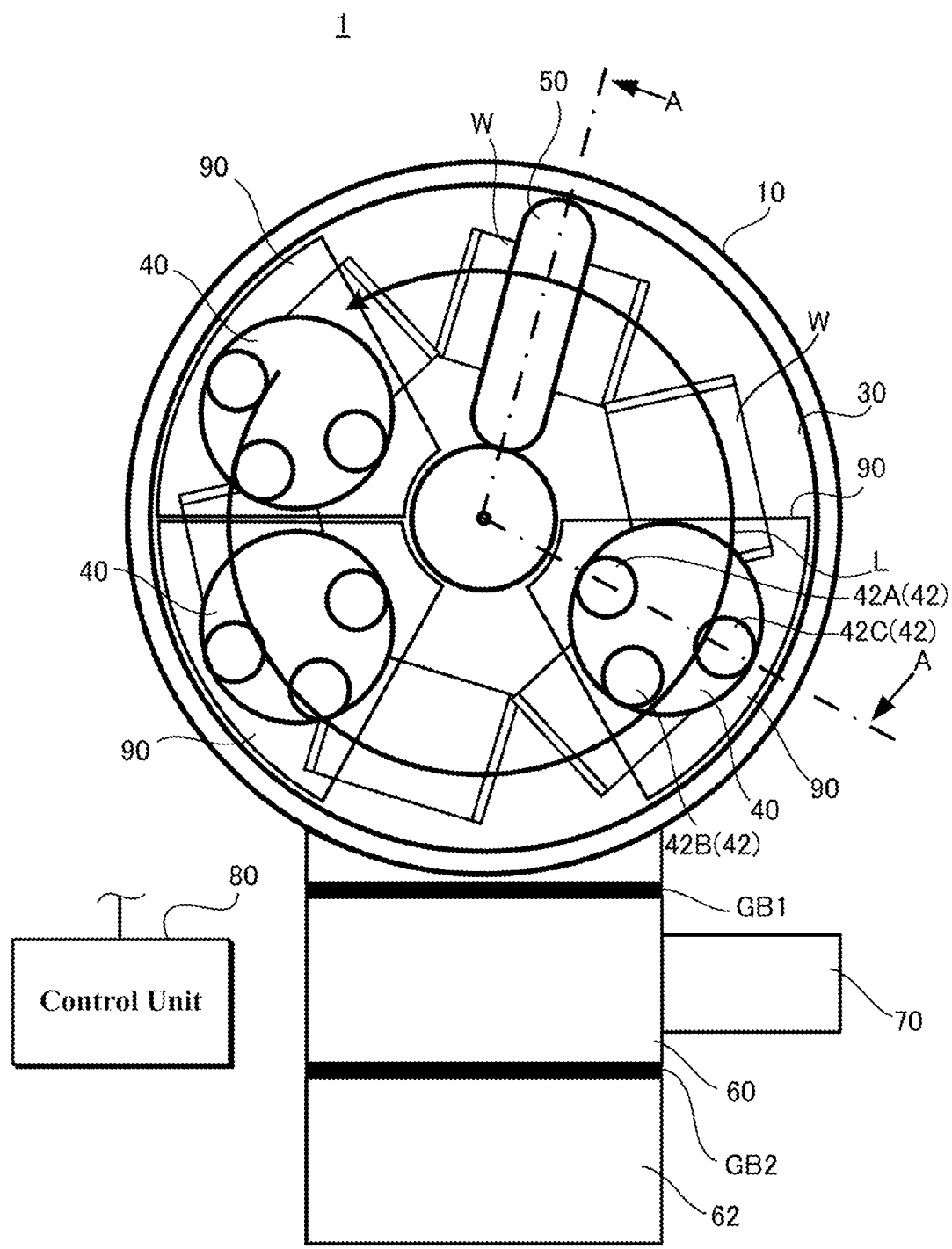
FIG. 1 is a perspective plan view schematically showing the configuration of a film formation apparatus of an embodiment.
Figure 2:
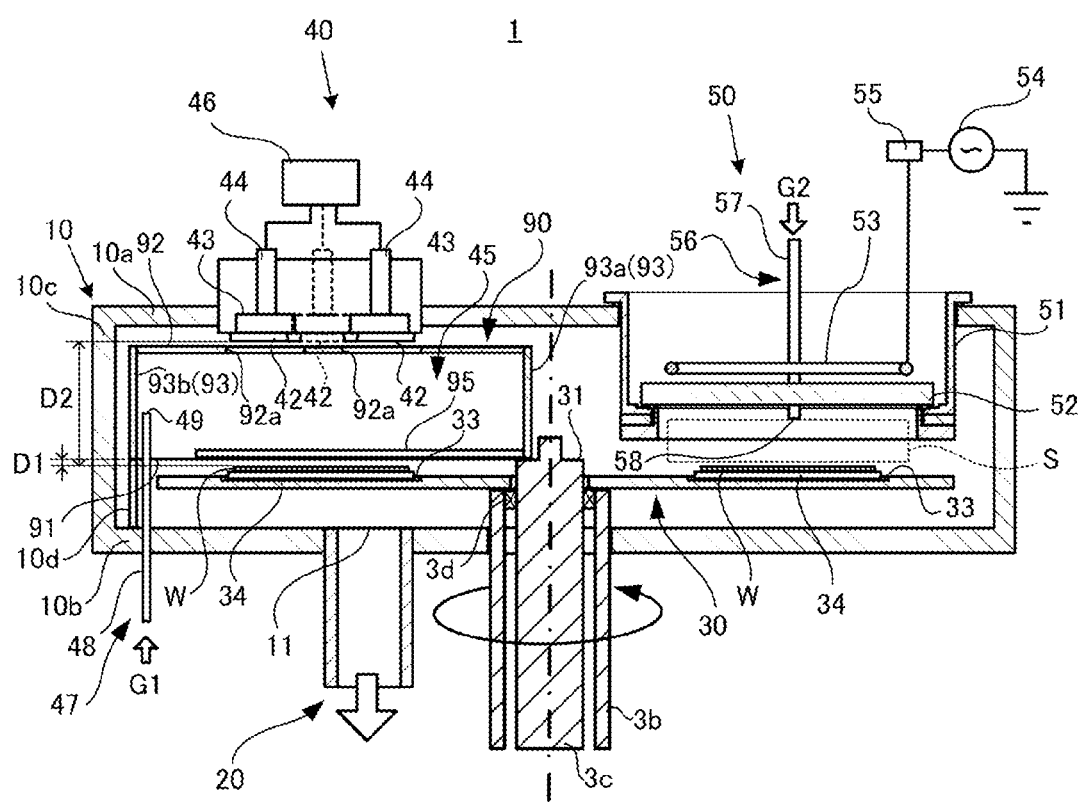
FIG. 2 is a cross-sectional view taken along line A-A in FIG. 1, and is a detailed side view of the internal configuration of the film formation apparatus of the embodiment shown in FIG. 1.

As shown in the perspective plan view of FIG. 1 and the cross-sectional view of FIG. 2, the film formation apparatus 1 is an apparatus for forming a film on a workpiece W by sputtering. The workpiece W is a glass substrate, a wafer, or the like. Note that the workpiece W can be anything that can be subjected to film formation by sputtering. The film formation apparatus 1 includes a chamber 10, an exhaust unit 20, a rotary table 30, film formation units 40, a film treatment unit 50, a transfer chamber 60, a cooling device 70, and a control unit 80.

The chamber 10 is a container which is highly airtight and which an interior thereof can be made vacuum. The exhaust unit 20 exhausts the inside of the chamber 10. The rotary table 30 is provided in the chamber 10 and circulates and carries the workpiece W along a circumferential carrying path L (see FIG. 1).

The film formation units 40 perform film formation treatment on the circulated and carried workpiece W by sputtering. Three film formation units 40 are aligned along the circumferential carrying path L. The film treatment unit 50 performs film treatment on a film formed on the workpiece W by the film formation units 40.

The transfer chamber 60 is a container for loading and unloading the workpiece W into and out of the chamber 10 via a gate valve GB1. The cooling device 70 is a device that removes water in the exhaust gas by cooling the exhaust gas from the chamber 10. The cooling device 70 of the embodiment is provided in the transfer chamber 60.

[Configuration]
[Chamber]

As shown in FIG. 1, the chamber 10 is a cylindrical container. Three film formation units 40 and one film treatment unit 50 are provided inside the chamber 10. Further, the transfer chamber 60 is connected to the chamber 10 in the region between the two film formation units 40.

As shown in FIG. 2, the chamber 10 is formed by a disk-like ceiling 10a, a disk-like bottom 10b, and an annular side wall 10c. The ceiling 10a is detachably provided on the side wall 10c. The ceiling 10a is mounted using a sealing member such as an O-ring (not shown in the drawing), thereby sealing the chamber 10. Removing the ceiling 10a enables maintenance including cleaning of the inside of the chamber 10.

[Exhaust Unit]

The exhaust unit 20 has a negative pressure circuit including piping and a pump, a valve, and the like (not shown in the drawing). The exhaust unit 20 is connected to an exhaust port 11 provided in the chamber 10. The exhaust unit 20 decompresses and makes the interior of the chamber 10 vacuum by exhausting air through the exhaust port 11.

[Rotary Table]

The rotary table 30 has a disk shape and expands in the chamber 10 so as not to come into contact with the inner peripheral surface of the side wall 10c. The rotary table 30 is made of metal and is, for example, obtained by spraying aluminum oxide on the surface of a stainless steel plate unit.

A hollow rotary cylinder 3b airtightly passes through the bottom 10b of the chamber 10 and stands inside the chamber 10. The rotary table 30 is attached to the rotary cylinder 3b. A drive mechanism (not shown in the drawing) is connected to the rotary cylinder 3b. The drive mechanism uses a motor as a drive source to continuously rotate the rotary table 3 at a predetermined rotation speed about the axis of the rotary cylinder 3b (indicated by the dot-and-dash line in FIG. 2). The axis of the rotary cylinder 3b corresponds to the center of the rotation of the rotary table 30. Suppose that, in the following description, the side of the rotary table 3 adjacent to the center of rotation is the inner peripheral side, and the side remote from the center of rotation is the outer peripheral side.

An immovable support column 3c is provided inside the hollow rotary cylinder 3b. The support column 3c is fixed to a base (not shown in the drawing) provided outside the chamber 10, passes through the bottom 10b of the chamber 10, and stands inside the chamber 10.

An opening is provided in the center of the rotary table 30. The support column 3c passes through the opening of the rotary table 3, and the tip of the support column 3c is located between the upper surface of the rotary table 30 and the ceiling 10a of the chamber 10. An inner peripheral support portion 31 that supports the shield member 90, which will be described later, is formed at the tip of the support column 3c. Since a ball bearing 3d is placed between the rotary cylinder 3b and the support column 3c, the rotary table 3 and the rotary cylinder 3b are rotatably supported by the support column 3c.

Each holder unit 33 is a groove, a hole, a protrusion, a jig, a holder, or the like circumferentially formed in the upper surface of the rotary table 30, and holds a tray 34 on which the workpiece W is placed, with a mechanical chuck, an adhesive chuck, or the like. The tray 34 is a member for transferring the workpiece W placed on it. Six holder units 33 of the embodiment are provided on the rotary table 30 at intervals of 60°. However, the numbers of workpieces W and trays 34 that are simultaneously transferred are not limited to this.

[Film Formation Unit]

Each film formation unit 40 generates plasma and exposes a target 42 composed of a film formation material to the plasma. As a result, the film formation unit 40 bombards the ions included in the plasma with the film formation material, and deposits the ejected particles of the film formation material on the workpiece W. As shown in FIG. 2, the film formation unit 40 includes a sputter source composed of a target 42, a backing plate 43, and electrodes 44, and a plasma generator composed of a shield member 90 defining a film formation chamber 45, a power supply unit 46, and a sputter gas introduction unit 47.

Each target 42 is a plate unit including a film formation material to be deposited on the workpiece W to be a film. The targets 42 are separately provided on the carrying path L of the workpiece W placed on the rotary table 30. The surface of the target 42 is held on the ceiling 10a of the chamber 10 so as to face the workpiece W placed on the rotary table 30. As shown in FIG. 1, multiple targets 42 are placed in positions at different radial distances from the center of the rotation of the rotary table 30 in a plan view. In the embodiment, three targets 42 are provided on the vertices of triangles in a plan view. The three targets 42 include 42A on the inner peripheral side, 42B at the midpoint, and 42C on the outer peripheral side. Hereinafter, when not being distinguished, the three are referred to as target 42.

The backing plates 43 are support members that hold the respective targets 42. The backing plates 43 hold the respective targets 42 individually via joint members. In (indium), for example, is used for the joint members. The electrodes 44 are conductive members for separately applying power to each target 42 from the outside of the chamber 10, and are electrically connected to the targets 42. The power applied to each target 42 can be changed independently. In addition, the sputter source is appropriately provided with a magnet, a cooling device, and the like, if necessary.

As shown in FIG. 2, the chamber 10 is provided with a film formation chamber 45 that surrounds a region where the film formation material from the target 42 is scattered. The film formation chamber 45 is formed in the space defined by the shield member 90. The shield member 90 suppresses the film formation material and sputter gas G1 from diffusing from the film formation chamber 45 into the chamber 10. Note that the shield member 90 has an opening 91 on the side facing the workpiece W that is circulated and carried by the rotary table 30 in order to scatter the film formation material from the targets 42. The shield member 90 can be made of, for example, aluminum or SUS.

Figure 3:
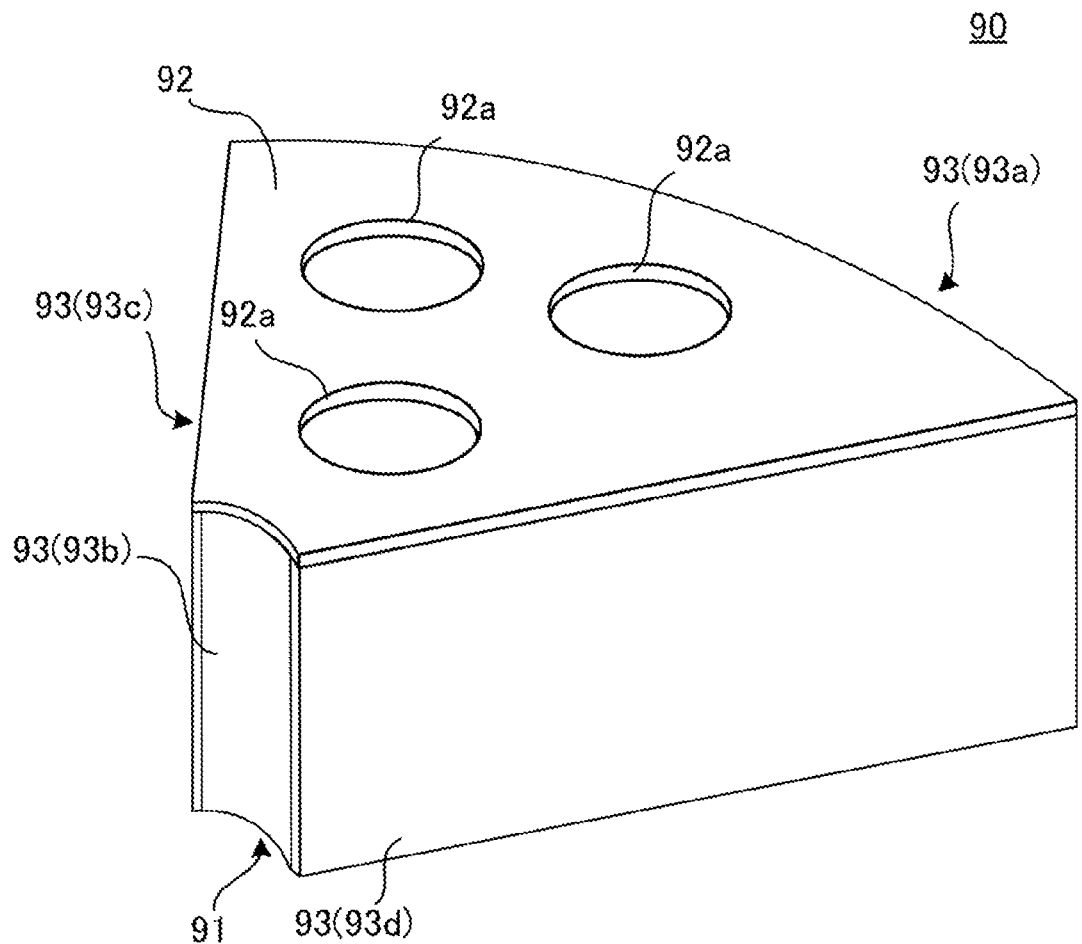
FIG. 3 is a perspective view of a shield member of the film formation apparatus of the embodiment.

To be specific, as shown in FIGS. 2 and 3, the shield member 90 has a cover 92 and a side 93. The cover 92 is a member that forms the ceiling of the film formation chamber 45. The cover 92 is an annular arc plate-like unit placed in parallel with the plane of the rotary table 30. In the cover 92, target holes 92a are formed in the positions of the respective targets 42 so that the targets 42 are exposed to the inside of the film formation chamber 45.

The side 93 is a member that forms the side wall of the film formation chamber 45. The side 93 has an outer peripheral wall 93a, an inner peripheral wall 93b, and partition walls 93c and 93d. The outer peripheral wall 93a and the inner peripheral wall 93b have a rectangular parallelepiped shape curved in an arc shape, and are plates extending in the direction of the axis of the rotary table 30. The upper edge of the outer peripheral wall 93a is attached to the arc-shaped outer edge of the cover 92. The upper edge of the inner peripheral wall 93b is attached to the arc-shaped inner edge of the cover 92.

The partition walls 93c and 93d have a flat rectangular parallelepiped shape and are plates extending in the direction of the axis of the rotary table 30. The partition walls 93c and 93d face each other in the direction of the transfer of the workpiece W. The upper edges of the partition walls 93c and 93d are attached to a pair of radial edges of the cover 92, respectively. The joint between the cover 92 and the side 93 is airtightly sealed. Note that the cover 92 and the side 93 may be formed integrally, that is, continuously made of a common material. With such a shield member 90, in the film formation chamber 45, the side surfaces of the upper portions and the peripheral edges are covered with the cover 92 and the sides 93, and an opening 91 is formed toward the workpiece W. Note that the shield member 90 does not necessarily have all of the outer peripheral wall 93a, the inner peripheral wall 93b, and the partition walls 93c and 93d. For example, the shield member 90 may be formed by attaching only the partition walls 93c and 93d to the cover 92.

As shown in FIG. 2, a gap D1 through which the workpiece W on the rotating rotary table 30 can pass is formed between the lower ends of the partition walls 93c and 93d and the rotary table 3. In other words, the heights of the partition walls 93c and 93d are set so that a slight gap is formed between the lower edge of the shield member 90 and the workpiece W. The gap D1 between the treatment target surface of the workpiece W and the shield member 90 is preferably 5 mm or less. This is to allow the workpiece W to pass through and maintain the pressure inside the film formation chamber 45. This is also to minimize the leakage of the sputter gas G1 from the film formation chamber 45 into the chamber 10.

In the embodiment, the heights of the partition walls 93c and 93d described above are set in such a manner that the bottom of the inner peripheral wall 93b of the shield member 90 is supported by the inner peripheral support portion 31 of the support column 3c, and the bottom of the outer peripheral wall 93a is supported by a support 10d standing on the bottom 10b of the chamber 10.

The shield member 90 formed as described above has an annular arc shape the diameter of which increases outward from the center in the radial direction of the rotary table 30 in a plan view. The opening 91 provided on the side of the shield member 90 facing the workpiece W also has an annular arc shape. The speed of the workpiece W held on the rotary table 30 passes through the region facing the opening 91 decreases toward the inner peripheral side and increase toward the outer peripheral side in the radial direction of the rotary table 30. Since the diameter of the opening 91 increases from the inner peripheral side toward the outer peripheral side, the difference in the time for the workpiece W to pass through the opening 91 can be reduced, and the difference in the film formation rate due to the difference in the time to pass through it can be reduced. Note that, in the embodiment, the opening 91 is narrowed by a blocking plate 95 described later and the time during which the workpiece W is exposed to the film formation material through the opening 91 is intentionally made different between the inner peripheral side and the outer peripheral side.

The region facing the opening 91 is the region where most of the film formation is done, but even in the region outside the opening 91, the film formation material leaks from the film formation chamber 45 and absolutely no film formation is therefore not guaranteed. In particular, the film formation region where film formation is done by exposure to the film formation material in the film formation unit 40 is slightly wider than the opening 91.

Figure 4:
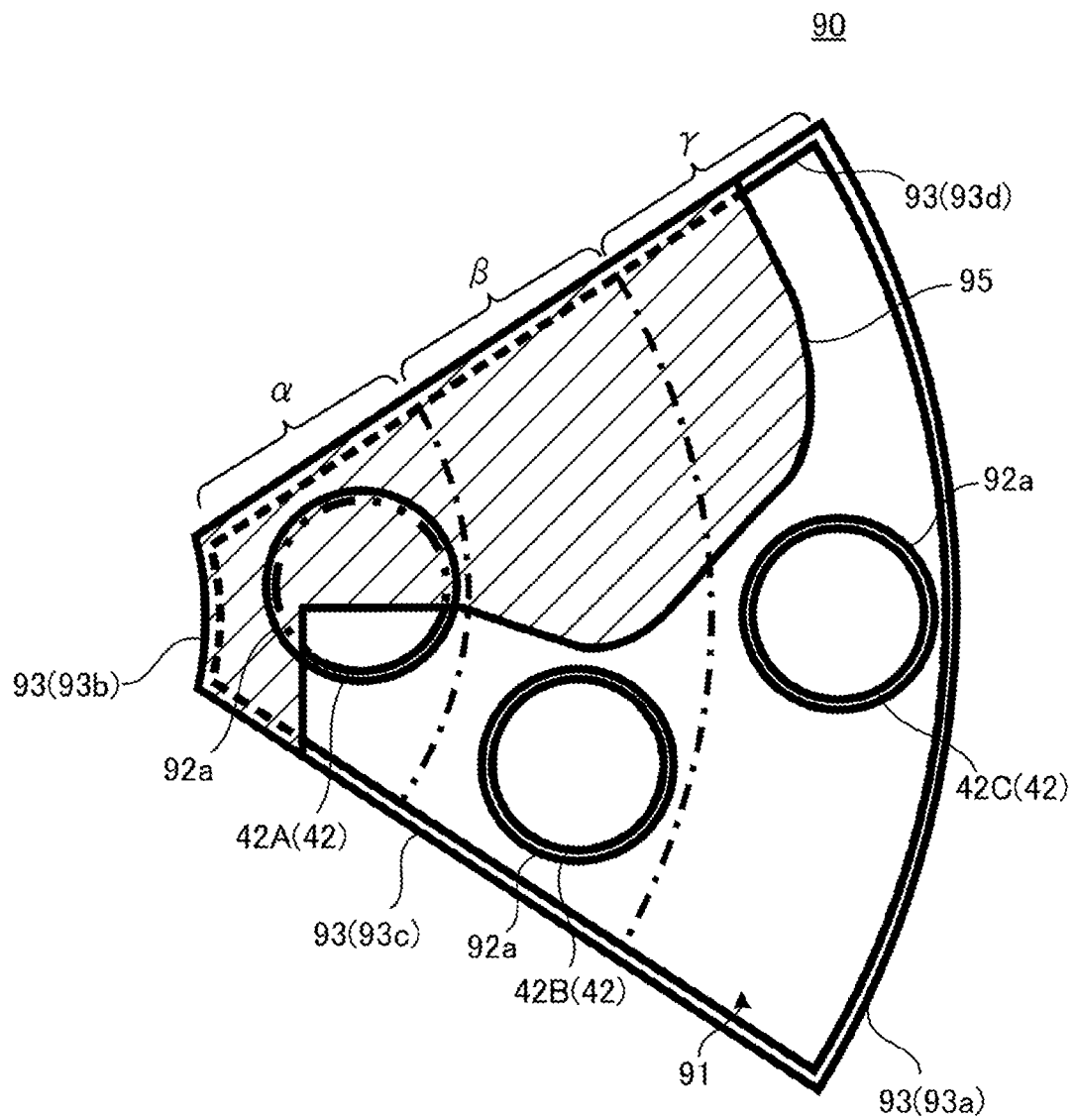
FIG. 4 is a bottom view of the shield member shown in FIG. 3.

Further, the shield member 90 is provided with a blocking plate 95 as shown by the hatching in FIG. 4. The blocking plate 95 blocks the film formation material scattered from the targets 42 by narrowing the opening 91. The blocking plate 95 adjusts the film thickness distribution by blocking the particles of the film formation material to not excessively adhere on spots where more film formation material tends to adhere and the film tends to become thick.

The blocking plate 95 is provided so as to extend from the partition wall 93d into the film formation chamber 45. As for the proportion of the area where the blocking plate 95 covers the opening 91, the region facing the target 42A that is closest to the center of the rotation of the rotary table 30 is larger than the region facing the target 42C that is farthest from the center of the rotation. The area where the blocking plate 95 covers the opening 91 is the area where the blocking plate 95 overlaps the opening 91 in the direction of the rotation axis of the rotary table 30. A region facing a target 42 is, of the region of the shield member 90 defined by the opening 91, the region that is separated along concentric circles centered on the center of the rotation of the rotary table 30 and includes a region directly under one target 42, but does not include a region directly under another target 42. To be specific, as shown in FIG. 4, it is each region of the opening 91 separated by the arcs indicated by the dot-and-dash lines.

These regions are annular arc-shaped regions facing the three targets 42A, 42B, and 42C, and are distinguished as, from the inner peripheral side closest to the center of rotation toward the outer peripheral side, the regions α, β, and γ. The proportion of the area of the blocking plate 95 to the area of the opening 91 of the shield member 90 without the blocking plate 95 provided is the largest in the region α, followed in order by the region β and the region γ. In other words, the closer the region is to the center of rotation of the rotary table 30, the larger the proportion of the area where the blocking plate 95 covers the opening 91. Further, in the embodiment, a part of the blocking plate 95 is provided in a position where it overlaps the target 42A on the inner peripheral side closest to the rotation center in the direction of the rotation axis of the rotary table 30. As a result, the time during which the workpiece W is exposed to the film formation material through the opening 91 is shorter in the region facing the target 42A closest to the rotation center than in the region facing the target 42C farthest from the rotation center.

Note that the blocking plate 95 may be integrally formed with the shield member 90. Alternatively, it may be composed of a member different from the shield member 90 and may be detachably attached to the shield member 90. Alternatively, a support member may be provided to support the blocking plate 95 supposed to be a member separate from the shield member 90, in the vicinity of the shield member 90. It is preferable that the blocking plate 95 be provided at the lower end of the shield member 90 so that it can be brought close to the workpiece W. The distance between the blocking plate 95 and the workpiece W is preferably 5 mm or less. This is to allow the workpiece W to pass through and maintain the pressure inside the film formation chamber 45.

However, even when the blocking plate 95 and the workpiece W are away from each other, the effect of blocking scattered particles of the film formation material can be produced by covering the opening 91 and narrowing the area of the opening 91. Therefore, the blocking plate 95 may be provided in a position other than the lower end side of the shield member 90. Note that the blocking plate 95 does not necessarily have to be provided on the partition wall 93d located upstream in the transfer direction of the workpiece W. For example, it can be provided on the partition wall 93c located downstream in the transfer direction.

The power supply unit 46 is, for example, a DC power supply and is electrically connected to the electrodes 44. The power supply unit 46 applies power to each target 42 through the electrodes 44. The rotary table 30 has the same potential as the grounded chamber 10, and a potential difference is generated by applying high voltage to the target 42 side. The power supply unit 46 can also be an RF power supply for performing high-frequency sputtering.

As described above, it is said that the cause of hillock formation is a rise in the temperature of the workpiece W, but although the temperature distribution on the surface of the workpiece is almost uniform, regions where hillocks are formed are not uniform. In order to alleviate the non-uniform distribution of the amount of deposit, the inventors have found that, when power applied to the targets 42 is 42A<42B<42C, less hillocks are formed on the film on the workpiece W in the region facing the target 42C on the outer peripheral side.

To be specific, when the radial distance from the center of rotation of the rotary table 30 to the center of the target 42 is 425 mm for the target 42A, 790 mm for the target 42B, and 1155 mm for the target 42C, power to be applied is set as follows.

Target 42A: 2.99 kW
Target 42B: 4.43 kW
Target 42C: 8.00 kW

Then, hillocks were not formed in the portion passing through the region γ facing the target 42C.

In other words, the inventors have found that hillock formation can be suppressed by setting the power applied to the multiple targets 42 to a certain level or more. Therefore, for example, it is conceivable that the hillock formation can be reduced by setting all the power applied to the targets 42A, 42B, and 42C to 8.00 kW or more.

Also in this case, in order to alleviate the non-uniform distribution of the amount of deposit on the inner peripheral side and the outer peripheral side, the magnitude of the power applied to the targets 42 must be set so that 42A<42B<42C. In that case, the power applied to the targets 42B and 42C must be further increased from the power applied to the target 42A on the inner peripheral side to which increased power is applied. Here, increasing the power applied to the target 42 also increases the temperature of the target 42 supported by the backing plate 43. When the temperature of the target 42 becomes excessively high, the joint member with the backing plate 43 melts and falls from the backing plate 43. Although the targets 42 are cooled by a cooling device, as described above, if the power applied to all the targets 42A, 42B, and 42C is set to such a level that any hillocks cannot be formed, while the power applied to the targets 42B and 42C on the outer peripheral side is further increased, heat cannot be dissipated even with the cooling device.

For this reason, even if the power applied to the multiple targets 42 is increased in order to suppress the hillock formation, there is a limit to the extent to which the power applied to the targets 42 on the inner peripheral side and the outer peripheral side is changed. Therefore, the non-uniform distribution of the amount of deposit on the inner peripheral side and the outer peripheral side cannot be alleviated, and the uniformity of the film thickness cannot be ensured.

In the embodiment, the power applied to all the targets 42 is set to a level that does not cause hillock formation. For example, the power applied to the three targets 42A, 42B, and 42C is set to a level that does not cause hillock formation. To be specific, in the case of DC power, if the applied power is 4.5 kW or less, hillock formation increases; thus, the power applied to all three targets 42A, 42B, and 42C is made higher than 4.5 kW. Preferably, the applied power is 8 kW or more. Further, the power applied to multiple targets 42 is increased with the radial distance of the rotary table 30 from the center of rotation. For example, for the three targets 42A, 42B, and 42C, the highest power is applied to the target 42A, followed in order by the targets 42B and 42C. Note that the applied power is made lower than the magnitude at which the joint material between the target 42 and the backing plate 43 melts. For example, it is set to 15 kW or less. In the embodiment, the non-uniform distribution of the amount of deposit is suppressed by the blocking plate 95 provided as described above.

As shown in FIG. 2, the sputter gas introduction unit 47 introduces sputter gas G1 into the film formation chamber 45. The sputter gas G1 is a gas that generates ions by plasma generated by applying power. The sputter gas G1 is, for example, an inert gas such as argon.

The sputter gas introduction unit 47 includes a source of sputter gas G1 such as a cylinder (not shown in the drawing) and a pipe 48. The pipe 48 is connected to the source of sputter gas G1 and airtightly passes through the chamber 10, extends into the inside of the shield member 90, and opens at the end as a gas inlet 49. The gas inlet 49 has an opening situated between the rotary table 30 and the target 42 to introduce the sputter gas G1 into the film formation chamber 45.

[Film Treatment Unit]

The film treatment unit 50 generates inductively coupled plasma in a treatment space S into which the process gas G2 has been introduced. As a result, the film formed on the workpiece W by the film formation unit 40 is subjected to film treatment. The film treatment is treatment for changing the characteristics of the film deposited by film formation, and includes oxidation, nitriding, etching, ashing, cleaning, and other treatment. For example, when oxidation is performed as film treatment, oxygen gas is turned into plasma to generate chemical species. The oxygen ions included in the generated chemical species bombard with the film on the workpiece W to form an oxide film which is a chemical compound film.

As shown in FIG. 2, the film treatment unit 50 has a plasma generator composed of a tubular body 51, a window member 52, an antenna 53, an RF power supply 54, a matching box 55, and a process gas introduction unit 56.

The tubular body 51 is a member that covers the periphery of the treatment space S where film treatment is performed. As shown in FIGS. 1 and 2, the tubular body 51 is a tube having a rounded rectangular horizontal cross section and an opening. The tubular body 51 is fitted into the ceiling 10a of the chamber 10 so that its opening remotely faces the rotary table 30, and projects into the internal space of the chamber 10. The tubular body 51 is made of the same metal as the rotary table 30, and its surface is subjected to plasma resistance treatment and film formation material adhesion prevention treatment by yttria thermal spraying or the like.

The window member 52 is a flat plate of a dielectric material such as quartz having a shape substantially similar to the horizontal cross section of the tubular body 51. The window member 52 is provided so as to close the opening of the tubular body 51, and separate the treatment space S in the chamber 10 into which the process gas G2 is introduced and the inside of the tubular body 51. The window member 52 may be a dielectric material such as alumina or a semiconductor such as silicon.

The treatment space S is formed between the rotary table 30 and the inside of the tubular body 51. The film treatment is performed by repeatedly passing the workpiece W circulated and carried by the rotary table 30 through the treatment space S.

The antenna 53 is a conductor wound into coil form, is placed in the internal space of the tubular body 51 separated from the treatment space S in the chamber 10 by the window member 52, and generates an electric field when carrying alternating current. The antenna 53 is preferably placed near the window member 52 so that the electric field generated from the antenna 53 is efficiently introduced into the treatment space S via the window member 52. An RF power supply 54 for applying a high frequency voltage is connected to the antenna 53. A matching box 55, which is a matching circuit, is connected to the output terminal of the RF power supply 54. The matching box 55 stabilizes the plasma discharge by matching the impedances at the input and the output.

As shown in FIG. 2, the process gas introduction unit 56 introduces the process gas G2 into the treatment space S. The process gas introduction unit 56 has the source of process gas G2 such as a cylinder (not shown in the drawing) and a pipe 57. The pipe 57 is connected to the source of process gas G2 and airtightly sealing the chamber 10, extends into the inside of the chamber 10, and opens at the end as a gas inlet 58.

The gas inlet 58 has an opening located in the treatment space S between the window member 52 and the rotary table 30 to introduce the process gas G2. The process gas G2 can be a rare gas, and preferably argon gas or the like. Besides the argon gas, oxygen ($O_2$) gas is added to the process gas G2 of the embodiment.

In such a film treatment unit 50, a high-frequency voltage is applied from the RF power supply 54 to the antenna 53. As a result, a high-frequency current flows through the antenna 53, and an electric field is generated by electromagnetic induction. An electric field is generated in the treatment space S via the window member 52 to turn the process gas G2 into plasma to generate inductively coupled plasma. This plasma generates chemical species of oxygen including oxygen ions, which bombard with the film on the workpiece W and bond with the atoms of the film material. Consequently, the film on the workpiece W becomes an oxide film.

The workpiece W is circulated and carried by the rotary table 30 and goes around within the chamber 10 many times, and thus alternately circulates and carries through the three film formation units 40 and the film treatment unit 50, so that film formation and film treatment are alternately repeated on the workpiece W, thereby growing a film with a desired thickness. Therefore, the film formation apparatus 1 of the embodiment is configured to be a batch type apparatus capable of forming a film on multiple workpieces W held by the multiple holder units 33 by batch.

[Transfer Chamber]

As shown in FIG. 1, the transfer chamber 60 is a path having an internal space to accommodate the workpiece W that is to be loaded into the chamber 10. The transfer chamber 60 is connected to the chamber 10 via a gate valve GB1. Although not shown in the drawing, the internal space of the transfer chamber 60 is provided with a transfer means for loading and unloading the workpiece W from and to the chamber 10. The transfer chamber 60 is depressurized by the exhaust by a vacuum pump (not shown in the drawing), and while the vacuum of the chamber 10 is maintained by the transfer means, the tray 34 on which a unprocessed workpiece W is placed is loaded into the chamber 10 and the tray 34 on which the processed-workpiece W is placed is unloaded from the chamber 10.

A load lock unit 62 is connected to the transfer chamber 60 via a gate valve GB2. The load lock unit 62 is a device that, while the vacuum of the transfer chamber 60 is maintained, loads the tray 34 on which an unprocessed workpiece W is placed from the outside into the transfer chamber 60 and unloads the tray 34 on which the processed workpiece W is placed from the transfer chamber 60 with a transfer means (not shown in the drawing). Note that the load lock unit 62 is depressurized by the exhaust by a vacuum pump (not shown in the drawing).

[Cooling Device]

As shown in FIG. 1, the cooling device 70 is connected to the transfer chamber 60. The cooling device 70 has a refrigerator and a cooling coil and condenses water molecules in the transfer chamber 60 into a cooling coil cooled by the refrigerator and traps them during exhaust with the aforementioned vacuum pump. Since moisture is trapped in the form of frost, defrosting is performed to remove frost from the coil during maintenance.

[Control Unit]

The control unit 80 controls various components of the film formation apparatus 1 such as an exhaust unit 20, a sputter gas introduction unit 47, a process gas introduction unit 56, a power supply unit 46, an RF power supply 54, a rotary table 30, a gate valve GB1, a transfer chamber 60, a gate valve GB2, a load lock unit 62, and a cooling device 70. The control unit 80 is a processing device including a programmable logic controller (PLC) and a central processing unit (CPU), and stores programs including description of matters to be controlled, set values, threshold values, and the like.

In particular, the matters to be controlled include the initial exhaust pressure of the film formation apparatus 1, the power applied to the target 42 and the antenna 53 and the related application times, the flow rates of the sputter gas G1 and the process gas G2, the introduction time and the exhaust time, the film formation time, and the speed of rotation of the motor of the drive mechanism. As a result, the control unit 80 can support a wide variety of film formation specifications.

[Operation]

The operation of the film formation treatment of the workpiece W in the film formation apparatus 1 will now be explained. In the following film formation treatment, film formation by sputtering using a target 42 of high-purity yttrium (Y) and film treatment for film oxidization are repeated to form an yttria ($Y_2O_3$) film having a film thickness of 1 to 100 μm. Further, in the film formation apparatus 1, the workpiece W is less likely to be heated because the distance D2 (see FIG. 2) between the target 42 and the workpiece W is relatively as long as 100 to 250 mm. The rotary table 30 can be rotated at, for example, 30 to 100 rpm. Suppose that before the film formation treatment, with the gate valve GB1 closed, the transfer means loads the tray 34 on which the workpiece W is placed from the load lock unit 62 into the transfer chamber 60, and the workpiece W and the tray 34 are dehumidified by the cooling device 70.

First, the trays 34 on which a workpiece W is placed are sequentially loaded into the chamber 10 from the transfer chamber 60 with a transfer means. The holder units 33 individually hold the trays 34 loaded by the transfer means, so that all the trays 34 on which the workpieces W are placed are placed on the rotary table 30.

Within the chamber 10, reducing the pressure inside the chamber 10 to a predetermined level by the exhaust unit 20 rotates the rotary table 30 on which the workpieces W are placed so that the rotation speed reaches a predetermined level. When the rotation speed reaches a predetermined level, film formation on the workpieces W by the film formation unit 40 starts. In particular, the sputter gas introduction unit 47 supplies the sputter gas G1 to the film formation chamber 45 through the gas inlet 49. The power supply unit 46 applies a voltage to the target 42 through the electrodes 44 to turn the sputter gas G1 into plasma. The ions generated by the plasma bombard with the target 42 and eject particles. When the workpieces W circulated and carried by the rotary table 30 pass through a region of the shield member 90 facing the opening 91, a thin film obtained by formation of particles are formed on the surfaces of the workpieces W. In the embodiment, a thin film of yttrium is formed. A thin film formed each passage through the film formation unit 40 preferably has a thickness of, for example, 1 to 2 atoms level (5 nm or less).

In this way, the thin film formed on each workpiece W is oxidized while passing through the film treatment unit 50. In particular, the process gas introduction unit 56 supplies the process gas G2 containing oxygen gas to the treatment space S through the gas inlet 58. Then, the chemical species of oxygen generated by the plasma bombard with the thin film on the workpiece W, turning the thin film into an oxide film. In the embodiment, an yttria film is formed.

In this way, film formation treatment in which the workpiece W passes through the film formation unit 40 in operation and oxidation treatment in which the workpiece W passes through the film treatment unit 50 in operation are repeatedly performed. As a result, the thickness of the film gradually increases. It should be noted that "in operation" is synonymous with performing plasma generation operation for generating plasma in the film formation chamber 45 and the treatment space S of each treatment unit.

Here, the power applied to the targets 42A, 42B, and 42C is made higher than 4.5 kW and higher toward the outer peripheral side, but lower than the magnitude at which the joint member between the target 42 and the backing plate 43 melts. This suppresses hillock formation in the film and reduces the difference between the inner and outer peripheral sides in the amount of deposited film formation material. For example, hillocks can be suppressed to 10 or less in the positions corresponding to the regions α, β, and γ, respectively. However, since the power applied to the target 42A on the inner peripheral side must be high, and the power to the target 42C on the outer peripheral side must also be set to a level that does not cause melting of the joint member between the target 42 and the backing plate 43, which means there is a limit to the extent of the difference between the magnitudes of applied power on the inner peripheral side and the outer peripheral side. For this reason, simply increasing the applied power increases the amount of deposit in the innermost region α. Note that the number of hillocks was observed in an yttria film deposited to a thickness of 5 μm or more on a flat substrate, with a laser microscope at a magnification of up to 5000 times.

In the embodiment, the proportion of the area where the blocking plate 95 covers the opening 91 is highest in the region α, and becomes lower in order of the regions β and γ. As a result, the amount of the film formation material that can be blocked in the region α on the inner peripheral side, particularly the innermost peripheral side can be increased, so that the difference in film formation rate between the inner and outer peripheral sides can be suppressed, ensuring the uniformity of the film thickness distribution. If the film formed each time the film passes through the film formation unit 40 becomes thicker on the inner peripheral side than on the outer peripheral side, the extent of film treatment in the film treatment unit 50 also differs. However, the embodiment can make the film thickness distribution uniform, thereby also making the amount of film treatment uniform. For example, the amount of oxidation in the film can be made uniform, which yields a uniform in-plane film quality.

The rotary table 30 continues to rotate until a predetermined thickness of oxide film is formed on the workpiece W, that is, until a lapse of a predetermined length of time determined in advance by simulation or experiment. After a lapse of a predetermined length of time determined, the operation of the film formation unit is first stopped, and the operation of the film treatment unit 50 is stopped. The rotation of the rotary table 30 is then stopped, and the tray 34 on which the workpiece W is placed is ejected from the load lock unit 62 via the transfer chamber 60.

[Action and Effect]

(1) As described above, the film formation apparatus 1 according to the embodiment includes: a chamber 10 which an interior thereof can be made vacuum; a rotary table 30 that is provided in the chamber 10 and that circulates and carries a workpiece W along a circumferential carrying path L; multiple targets 42 that include a film formation material to be deposited and become a film on the workpiece W, face the workpiece W circulated and carried by the rotary table 30, and that are provided in positions at different radial distances from a center of rotation of the rotary table 30; a shield member 90 that forms a film formation chamber 45 surrounding a region where the film formation material from each target 42 scatters, and that has an opening 91 on the side facing the workpiece W which is circulated and carried by the rotary table 30; and a plasma generator that includes a sputter gas introduction unit 47 for introducing a sputter gas G1 into the film formation chamber 45, and a power supply unit 46 for applying power to the target 42, and generates plasma in the sputter gas G1 in the film formation chamber 45 by applying power to the target 42.

The time during which the workpiece W is exposed to the film formation material through the opening in the region facing the target 42 closest to the center of rotation is shorter than the time during which the workpiece W is exposed to the film formation material through the opening 91 in the region facing the target 42 farthest from the center of rotation.

Therefore, even when the power applied to the target 42 closest to the center of rotation is increased, the time during which the workpiece W is exposed to the film formation material is shortened on the inner peripheral side where the film formation rate becomes excessive. Therefore, applying, for example, high power that does not cause hillock formation to the target 42 ensures the uniformity of the film thickness distribution while suppressing hillock formation.

(2) A blocking plate 95 that blocks the film formation material scattered from the target 42 by narrowing the opening 91 is provided, and the proportion of the area where the blocking plate 95 covers the opening 91 is higher in a region facing the target 42 closest to the center of rotation than in a region facing the target 42 farthest from the center of rotation. Therefore, the blocking plate 95 can block more film formation material on the inner peripheral side where the film formation rate is excessive than on the outer peripheral side, thereby ensuring the uniformity of the film thickness distribution.

(3) Three or more targets 42 are used and the proportion of the area where the blocking plate 95 covers the opening 91 is higher in regions closer to the center of rotation of the rotary table 30. Since the deposited film tends to be thicker from the outer peripheral side toward the inner peripheral side, narrowing the opening 91 toward the inner peripheral side allows more film formation material to be blocked, and the uniformity of overall film thickness distribution can be obtained.

(4) A part of the blocking plate 95 is provided in a position where the rotary table 30 overlaps with the target 42 closest to the center of rotation in the direction of the rotation axis. Although the film formation rate is high in the region facing the target 42 closest to the center of rotation, providing the blocking plate 95 there suppresses the film formation rate on the innermost peripheral side.

(5) The power applied to each target 42 is higher than 4.5 kW. As a result, the power applied to all the targets 42 increases to a magnitude of power that suppresses hillock formation.

(6) The film treatment unit 50 is provided in the chamber 10 and, each time a circulated and carried workpiece W passes through the film formation unit 40, performs film treatment on the workpiece W. Since film formation treatment and film treatment are alternately performed multiple times by circulation transfer, the thin film formed by the film formation unit 40 is subjected to film treatment to form a chemical compound film. This series of film formation treatments in which the film formation unit 40 deposits a film having an in-plane uniform film thickness and the film treatment unit 50 performs film treatment allows film treatment to be performed uniformly on the film formed with a uniform film thickness, thereby forming a film having a uniform film quality on the workpiece W.

Other Embodiments

Although the embodiment of the present disclosure and the modification of each component have been described, the embodiment and the modification of each component have been presented as an example to which the scope of the invention should not be limited. These novel embodiments described above can be implemented in various other modes, and various omissions, replacements, and changes can be made without departing from the gist of the invention. These embodiments and modifications thereof are included in the scope and gist of the invention, and are also included in the invention described in the claims.

The time during which the power supply unit 46 applies power to the target 42 closest to the center of rotation may be shorter than the time during which it applies power to the target 42 farthest from the center of rotation. For example, the time during which power is applied to the three targets 42A, 42B, and 42C is made shorter with decreasing distance along the radial direction of the rotary table 30 toward the center of rotation. For example, power is continuously applied to the target 42C during a predetermined film formation time (total film formation time) for formation of a predetermined film thickness, power is applied to the target 42B after a lapse of about half of the total film formation time, and power is applied to the target 42A after a lapse of about 60% of the total film formation time. Further, for example, when the power supply is one that repeatedly turns ON/OFF like a pulse power supply, the ON/OFF time gap is adjusted so that the total time during which power is applied is expressed as target 42A<target 42B<target 42C during the total film formation time. This also makes it possible to shorten the time during which the workpiece W is exposed to the film formation material on the inner peripheral side where the film formation rate becomes excessive. Therefore, the power applied to the target 42 is set to, for example, a high magnitude at which hillock formation does not occur, thereby suppressing hillock formation and also ensuring the uniformity of the film thickness distribution. Further, when there are three or more targets 42, the time during which power is applied to the targets 42 is made shorter toward the center of rotation, so that the amount of film formation material used in each region can be reduced toward the inner peripheral side, which yields the uniformity of the overall film thickness distribution.

The power applied to each target 42 may be made equal. For example, the powers applied to the three targets 42A, 42B, and 42C are set to an equal value higher than 4.5 kW that does not cause hillock formation. This facilitates settings on the powers applied to the targets 42. In this case, the difference in film formation rate between the inner and outer peripheral sides is significant, but the uniformity of the film thickness distribution can be ensured by increasing the proportion of the area on the inner peripheral side where the blocking plate 95 covers the region facing the target 42.

The numbers of film formation units 40, film treatment units 50, and targets 42 are not limited to the numbers mentioned above as an example. The numbers of film formation units 40 and film treatment units 50 may be singular or plural, respectively. As described above, multiple film formation units 40 using the targets 42 of the same quality of film formation material may be provided and operated at the same time to increase the film formation rate, or one of the film formation units 40 may be selectively operated to lower the film formation rate. Multiple film formation units 40 using targets 42 of different film formation materials may be provided so that multiple types of films can be formed, or multilayer films each containing different materials may be laminated. Multiple film treatment units 50 performing the same type of film treatment may be provided to increase the rate of film treatment, or multiple film treatment units 50 performing different types of film treatment may be provided. Note that the film treatment units 50 may be omitted. In this case, film treatment is not necessarily performed, or film treatment may be performed in another film treatment apparatus. Further, the number of targets located at different distances from the center of rotation only has to be plural and is not limited to three.

The direction of rotary table 30 and the location of each film formation unit 40 and film treatment unit 50 are not necessarily as described above. The rotary table 30 does not necessarily have a horizontal rotation plane but may have a vertical or inclined rotation plane. A workpiece W may be supported only on one side of a rotary table 30 and a film formation unit 40 and a film treatment unit 50 may be located so that they face it. Alternatively, a workpiece W may be supported on both sides, and film formation units 40 and film treatment units 50 may be located so that they face the respective ones. For example, in the aforementioned mode assuming that the gravity acts downward, the workpiece W is placed on the upper side of each rotary table 30, and the film formation unit 40 and the film treatment unit 50 are placed above, but the workpiece W may be held only on the lower side of the rotary table 30, and the film formation unit 40 and the film treatment unit 50 may be placed only below, or the workpiece W may be held on both the upper and lower sides, and the film formation unit 40 and the film treatment unit 50 may be placed both above and below.

REFERENCE SIGN

1: Film formation apparatus
3: Rotary table
3b: Rotary cylinder
3c: Support column
3d: Ball bearing
10: Chamber
10a: Ceiling
10b: Bottom
10c: Side wall
10d: Support
11: Exhaust port
20: Exhaust unit
30: Rotary table
31: Inner peripheral support portion
33: Holder unit
34: Tray
40: Film formation unit
42, 42A, 42B, 42C: Target
43: Backing plate
44: Electrode
45: Film formation chamber
46: Power supply unit
47: Sputter gas introduction unit
48: Pipe
49: Gas inlet
50: Film treatment unit
51: Tubular body
52: Window member
53: Antenna
54: RF power supply
55: Matching box
56: Process gas introduction unit
57: Pipe
58: Gas inlet
60: Transfer chamber
62: Load lock unit
70: Cooling device
80: Control unit
90: Shield member
91: Opening
92: Cover
92a: Target hole
93: Side
93a: Outer peripheral wall
93b: Inner peripheral wall
93c, 93d: Partition wall
95: Blocking plate

The invention claimed is:
1. A film formation apparatus comprising:
a chamber which an interior thereof can be made vacuum;
a rotary table that is provided in the chamber and that circulates and carries a workpiece along a circumferential carrying path;
multiple targets that include a film formation material to be deposited and become a film on the workpiece, that face the workpiece circulated and carried by the rotary table, and that are provided in positions at different radial distances from a center of rotation of the rotary table;

a shield member that forms a film formation chamber surrounding a region where the film formation material from the multiple targets scatter, and that has an opening on a side facing the workpiece which is circulated and carried by the rotary table;

a plasma generator that includes a sputter gas introduction unit for introducing a sputter gas into the film formation chamber, and a power supply unit for applying power to the target, and that generates plasma in the sputter gas in the film formation chamber; and a blocking plate that blocks the film formation material scattered from the target by narrowing the opening, wherein a first proportion of an area where the blocking plate covers the opening in a region facing the target closest to the center of rotation is larger than a second proportion of an area where the blocking plate covers the opening in a region facing the target farthest from the center of rotation, wherein the region facing the target farthest from the center of rotation is a region that has an annular arc shape obtained by partitioning, along concentric circles centered on the center of rotation, a region defined by the opening, and that includes a region directly under the target farthest from the center of rotation, but does not include a region directly under the other targets, and wherein the region facing the target closest to the center of rotation is a region that has the annular arc shape and that includes a region directly under the target closest to the center of rotation, but does not include a region directly under the other targets.

2. The film formation apparatus according to claim 1, wherein
the number of targets is three or more, and
the proportion of an area where the blocking plate covers the opening in each region increases toward the center of rotation.

3. The film formation apparatus according to claim 2, wherein a part of the blocking plate is provided in a position where the rotary table overlaps with the target closest to the center of rotation in a direction of a rotation of the rotary table.

4. The film formation apparatus according to claim 1, wherein time during which the power supply unit applies power to the target closest to the center of rotation is shorter than time during which the power supply unit applies power to the target farthest from the center of rotation.

5. The film formation apparatus according to claim 4, wherein
the number of targets is three or more, and
the time during which power is applied to each target is shorter toward the center of rotation.

6. The film formation apparatus according to claim 1, wherein the power applied to each target is higher than 4.5 kW.

7. The film formation apparatus according to claim 6, wherein an equal level of power is applied to the targets.

8. The film formation apparatus according to claim 1, further comprising a film treatment unit that is provided in the chamber, and that performs film treatment on the film each time the circulated and carried workpiece passes through the film formation unit and the film is formed.

* * * * *